US011133212B2

United States Patent
Khaja et al.

(10) Patent No.: US 11,133,212 B2
(45) Date of Patent: Sep. 28, 2021

(54) HIGH TEMPERATURE ELECTROSTATIC CHUCK

(71) Applicant: Applied Materials, Inc., Santa Clara, CA (US)

(72) Inventors: Abdul Aziz Khaja, San Jose, CA (US); Jun Ma, Milpitas, CA (US); Hyung Je Woo, San Jose, CA (US); Fei Wu, Sunnyvale, CA (US); Jian Li, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/381,986

(22) Filed: Apr. 11, 2019

(65) Prior Publication Data

US 2019/0355608 A1  Nov. 21, 2019

Related U.S. Application Data

(60) Provisional application No. 62/672,317, filed on May 16, 2018.

(51) Int. Cl.
| | | |
|---|---|---|
| *H01L 21/683* | (2006.01) | |
| *H01L 21/67* | (2006.01) | |
| *H01L 21/687* | (2006.01) | |

(52) U.S. Cl.
CPC .... *H01L 21/6833* (2013.01); *H01L 21/67248* (2013.01); *H01L 21/6875* (2013.01); *H01L 21/67103* (2013.01)

(58) Field of Classification Search
CPC ............... B23B 31/28; H01L 21/67103; H01L 21/67248; H01L 21/6831; H01L 21/6833; H01L 21/6875; H01L 21/68757; Y10T 279/23

See application file for complete search history.

(56) References Cited

U.S. PATENT DOCUMENTS 5,530,616 A * 6/1996 Kitabayashi ........ H01L 21/6831
361/234
5,761,023 A * 6/1998 Lue .......................... G03F 7/707
361/234

(Continued)

FOREIGN PATENT DOCUMENTS

| JP | H07-018438 A | 1/1995 |
|---|---|---|
| KR | 10-2017-0042359 A | 4/2017 |

OTHER PUBLICATIONS

Shackelford, James F. Alexander, William. (2001). CRC Materials Science and Engineering Handbook (3rd Edition)—7.4 Resistivity of Ceramics. Taylor & Francis. Retrieved from https://app.knovel.com/hotlink/pdf/id:kt00C8V7Y1/crc-materials-science/resistivity-ceramics (Year: 2001).*

(Continued)

*Primary Examiner* — Eric A. Gates
*Assistant Examiner* — Chwen-Wei Su
(74) *Attorney, Agent, or Firm* — Patterson + Sheridan LLP

(57) ABSTRACT

A substrate support is disclosed. The substrate support has a dielectric body with a plurality of features formed thereon. A ledge surrounds the plurality of features about a periphery thereof. The features increase in number from a central region of the substrate support towards the ledge. A seasoning layer is optionally disposed on the dielectric body.

15 Claims, 5 Drawing Sheets

(56) References Cited

U.S. PATENT DOCUMENTS

| | | | | |
|---|---|---|---|---|
| 5,777,838 | A | * | 7/1998 | Tamagawa .......... H01L 21/6831 279/128 |
| 7,138,629 | B2 | * | 11/2006 | Noji .................... G01N 23/225 250/311 |
| 7,248,456 | B2 | * | 7/2007 | Nakamura ........ H01L 21/67109 279/128 |
| 9,939,736 | B2 | * | 4/2018 | Houben .............. H01L 21/6831 |
| 10,418,266 | B2 | * | 9/2019 | Horiuchi ............ H01L 21/6831 |
| 2003/0001103 | A1 | * | 1/2003 | Kobayashi ............ B25B 11/005 250/440.11 |
| 2015/0311106 | A1 | * | 10/2015 | Koizumi .......... H01J 37/32697 156/345.54 |
| 2015/0311108 | A1 | * | 10/2015 | Horiuchi ............ H01L 21/6875 269/302 |
| 2016/0049323 | A1 | * | 2/2016 | Ye ...................... H01L 21/6833 361/234 |
| 2016/0064264 | A1 | * | 3/2016 | Kulshreshtha ...... H01L 21/6833 438/787 |
| 2016/0370712 | A1 | * | 12/2016 | Shibazaki .......... G03F 7/70733 |
| 2017/0243778 | A1 | * | 8/2017 | Kouno .............. H01L 21/67103 |
| 2018/0033672 | A1 | * | 2/2018 | Woytowitz .......... C23C 16/4581 |
| 2018/0148835 | A1 | * | 5/2018 | Erickson ............. C23C 16/4411 |
| 2019/0214235 | A1 | * | 7/2019 | Yokogawa ................ C23C 4/01 |

OTHER PUBLICATIONS

Sun Yuchun et al., "Design Space of Electrostatic Chuck in Etching Chamber," Journal of Semiconductors, vol. 36, No. 8, Aug. 2015, 084004-1-084004-7.

Shu Qin et al., "Deep-Depletion Breakdown of Johnsen-Rahbek Type Electrostatic Chuck Operation for Semiconductor Processes," Journal of Applied Physics, 104, 094902.

M. H. Bocanegra-Bernal et al., "Mechanical Properties of Silicon Nitride-Based Ceramics and Its Use in Structural Applications at High Temperatures," Materials Science and Engineering A, 2010, 527, 1314-1338.

Hong-Ryul Kim et al., "Effect of O2 Plasma Treatment on the Properties of SiO2 Aerogel Film," Thin Solid Films, 1998, 332, 444-448.

Shu-Qin et al., "Wafer Dependence of Johnsen-Rahbek Type Electrostatic Chuck for Semiconductor Processes," Journal of Applied Physics, 2007, 102, 064901.

Korean Office Action for Patent Application No. 10-2019-0056425 dated Oct. 8, 2020.

KR Office Action dated Apr. 26, 2021 for Application No. 10-2019-0056425.

Korean Office Action dated Jun. 23, 2021 for Application No. 10-2019-0056425. (with Machine Translation).

* cited by examiner

HIGH TEMPERATURE ELECTROSTATIC CHUCK

CROSS-REFERENCE TO RELATED APPLICATIONS

This application claims priority under 35 U.S.C. § 119 (e) to U.S. Provisional Application No. 62/672,317, filed May 16, 2018, which is incorporated by reference herein.

BACKGROUND

Field

Embodiments of the present disclosure generally relate to substrate supports for semiconductor processing.

Description of the Related Art

Device geometries, such as semiconductor devices, continue to shrink in size and increase in complexity. As such device geometries advance, so too do the requirements of methods and components used to perform manufacturing processes. One example of such components is electrostatic chucks used in semiconductor processing. Today's semiconductor devices are made from ever increasing numbers of layers and increased layer thicknesses formed at higher processing temperatures. The increased layers and processing temperatures commonly result in bowing of the substrate (i.e., a deflection of the substrate across a diameter thereof). In some instances, substrates may have as much as 1 millimeter (mm) of deflection, or more. Conventional electrostatic chucks are unable to adequately chuck the increased deflection of the substrates due to, for example, inability to provide strong enough chucking force or arcing due to high chucking voltages. Additionally, new processing techniques require more consistent chucking forces to be applied over the life of the electrostatic chuck. Therefore, there is a need for improved electrostatic chucking devices.

SUMMARY

The present disclosure generally relates to substrate supports for semiconductor processing.

In one embodiment, a substrate support has a temperature control base coupled to a dielectric body. The dielectric body has a substrate chucking surface thereon that is partially defined by a ledge formed on the periphery of the dielectric body. An electrode is disposed within the dielectric body. A plurality of features is formed radially inward of the ledge. The number of features increases radially from a center of the substrate chucking surface to the ledge.

In another embodiment, a substrate support has a dielectric body. The dielectric body has a substrate chucking surface thereon that is partially defined by a ledge formed on the periphery of the dielectric body. An electrode is disposed within the dielectric body. A plurality of features is formed radially inward of the ledge. The number of features increases radially from a center of the substrate chucking surface to the ledge. A seasoning layer is formed on the dielectric body which is resistant to degradation from exposure to a processing chemistry.

In yet another embodiment, a substrate support has a dielectric body with a substrate chucking surface thereon. The substrate chucking surface is partially defined by a ledge formed on the periphery of the dielectric body. An electrode disposed within the dielectric body. A plurality of features is formed on the substrate chucking surface, wherein distribution of the plurality of features is greater at a periphery of the substrate chucking surface than at a central region thereof. The dielectric body has a resistivity selected in relation to an operating temperature of the substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to a substrate support for semiconductor manufacturing. The substrate support has a dielectric body with a plurality of features formed thereon. A ledge surrounds the plurality of features about a periphery thereof. The features increase in number from a central region of the substrate support towards the ledge to provide an increased chucking force towards the ledge. A seasoning layer is optionally disposed on the dielectric body to provide resistance to degradation form exposure to a processing chemistry.

Figure 1:
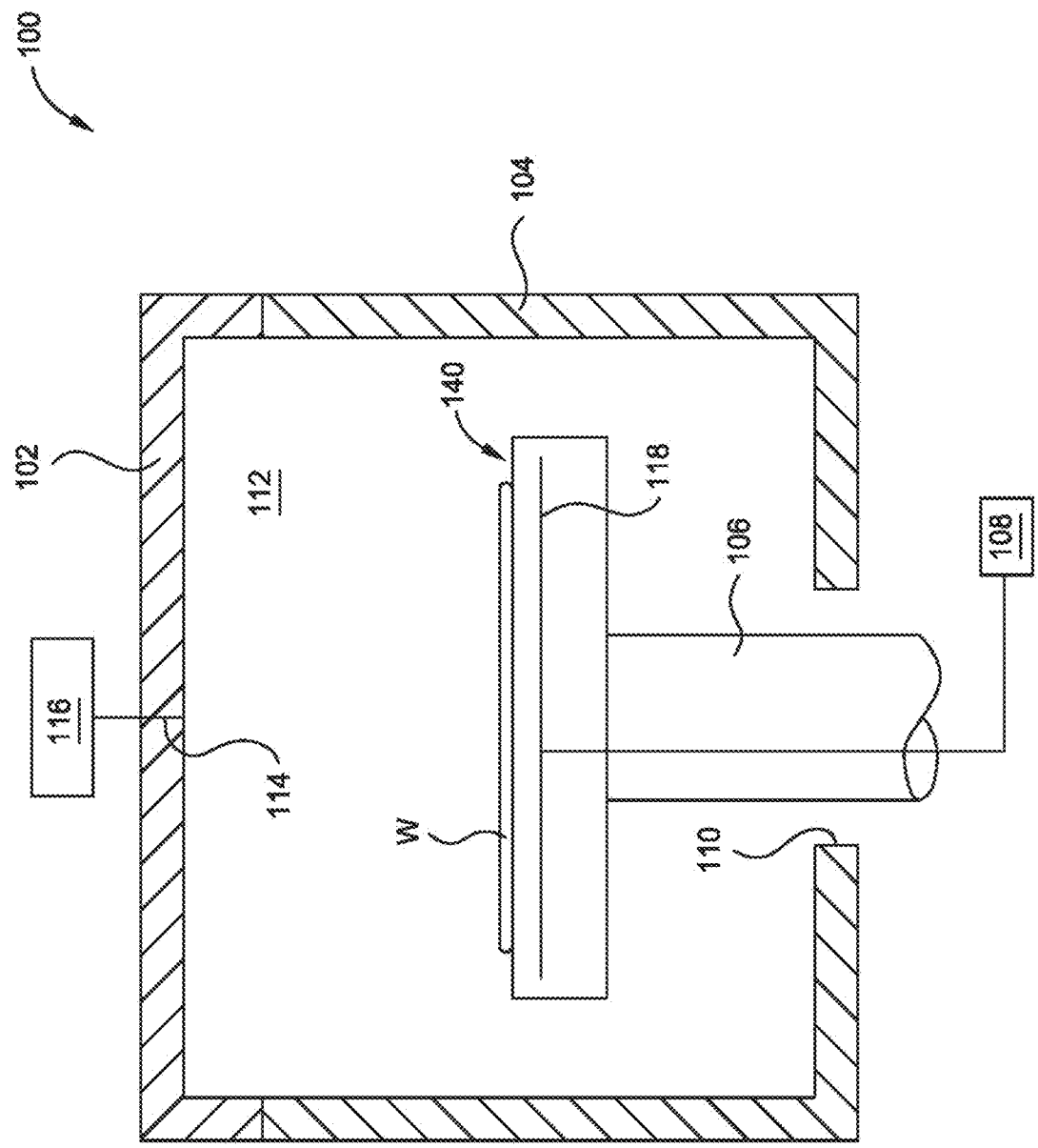
FIG. 1 is a schematic arrangement of a processing chamber, according to an embodiment of the disclosure.

FIG. 1 is an exemplary processing chamber 100 having a substrate support 140 therein. The processing chamber 100 includes a chamber body 104 with a lid 102 coupled thereto defining a processing volume 112. A process gas entrance port 114 may be formed though the lid 102 for providing a process gas from a gas source 116 into an interior of the chamber body 104. A shaft 106 extends into the processing volume 112 through an opening 110 in a lower portion of the chamber body 104. The shaft 106 is coupled to and supports the substrate support 140. A substrate W is shown disposed on the substrate support 140. The substrate W may be a planar wafer or a three-dimensional (3D) stacked wafer. A power source 108 is coupled to an electrode 118 disposed within the substrate support 140 through the shaft 106. The power source 108 biases the electrode 118 to chuck the substrate W to the substrate support 140. In one example, the substrate support 140 is an electrostatic chuck.

The substrate support 140 may be used with suitable processing chambers, including processing chambers not illustrated. Suitable processing chambers include those manufactured by Applied Materials, Inc., of Santa Clara, Calif. However, other processing chambers, including those from other manufacturers, are contemplated. Such processing chambers may include, for example, etch chambers as well as deposition chambers.

Figure 2:
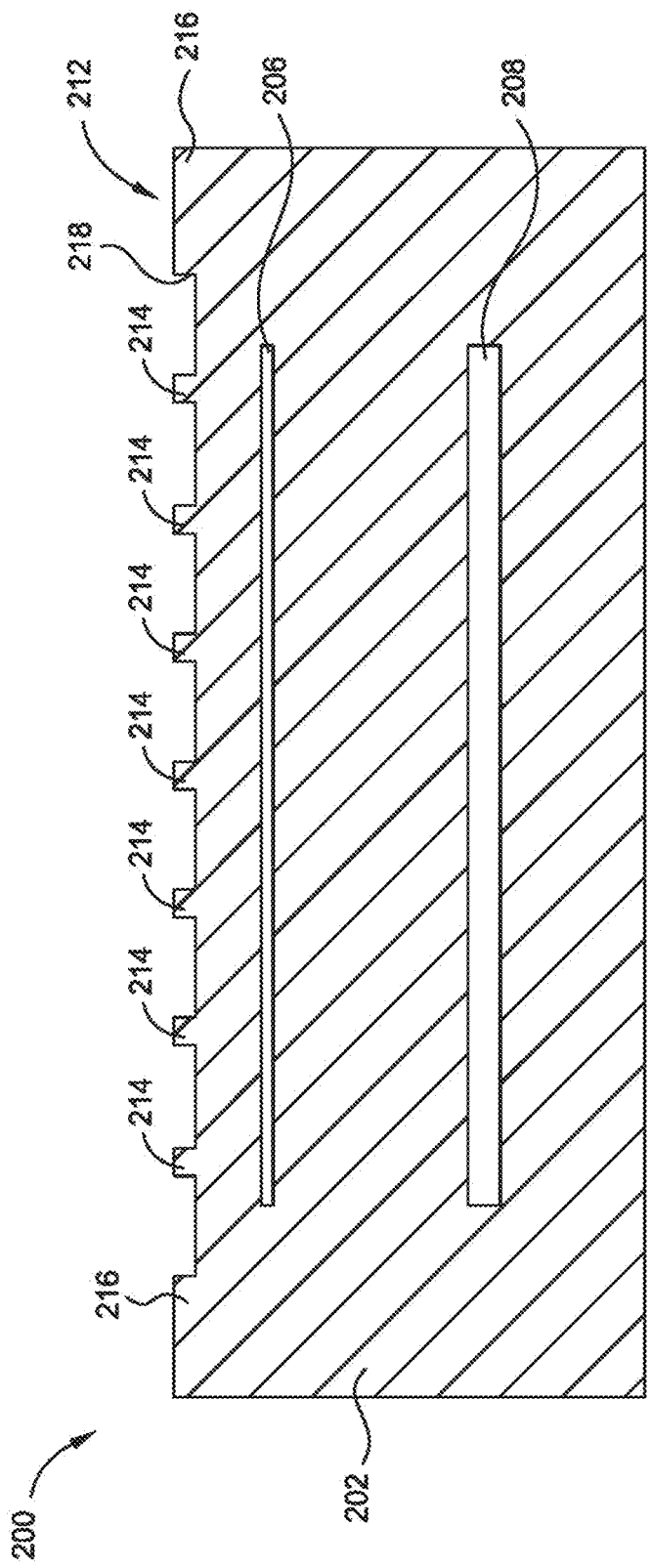
FIG. 2 is a cross-section of an exemplary substrate support, according to an embodiment of the disclosure.

FIG. 2 is a cross-section of an exemplary substrate support 200. The substrate support 200 may be used as the substrate support 140 of FIG. 1. The substrate support 200 has a dielectric body 202. The dielectric body 202 is made from a dielectric material, such as a ceramic like alumina or aluminum nitride. A temperature control device 208 is disposed within the dielectric body 202. The temperature control device 208 functions to heat or cool the substrate support 200 to a desired temperature. In one example, the temperature control device 208 is a resistive heater. In another embodiment, the temperature control device 208 is a channel configured to flow a heated or cooled fluid, such as air, nitrogen, water, glycol, or the like, therethrough to conduct heat to and/or from the dielectric body 202. The temperature control device 208 can raise the temperature of the substrate support 200 to a temperature above 350 degrees Celsius, such as above 550 degrees Celsius, for example, about 650 degrees Celsius. An electrode 206 is also disposed within the dielectric body 202. The electrode 206 is coupled to a power source (such as power source 108 in FIG. 1) which provides an electric charge thereto to chuck a substrate to the substrate support 200.

The dielectric body 202 has a substrate chucking surface 212. A ledge 216 is formed about a periphery of the dielectric body 202 partially defining substrate chucking surface 212. The ledge 216 has a width, for example, of about 2.5 mm but other sizes, such as about 0.5 mm, about 1 mm, about 4 mm, about 5 mm, or even larger, may be used. The ledge 216 also defines a recess 218 in the dielectric body 202 radially inward of the ledge 216. A plurality of features 214 is disposed in the recess 218. The features 214 extend from a surface of the recess 218 to define an interior portion of the substrate chucking surface 212. The features 214 are, for example, cylindrical dimples, ridges, hemispherical protrusions, or the like. In one example, the features 214 extend from the recess 218 at a height of about 10 microns to about 50 microns. In another example, the features 214 have a diameter from about 1 mm to about 2 mm.

Figure 3:
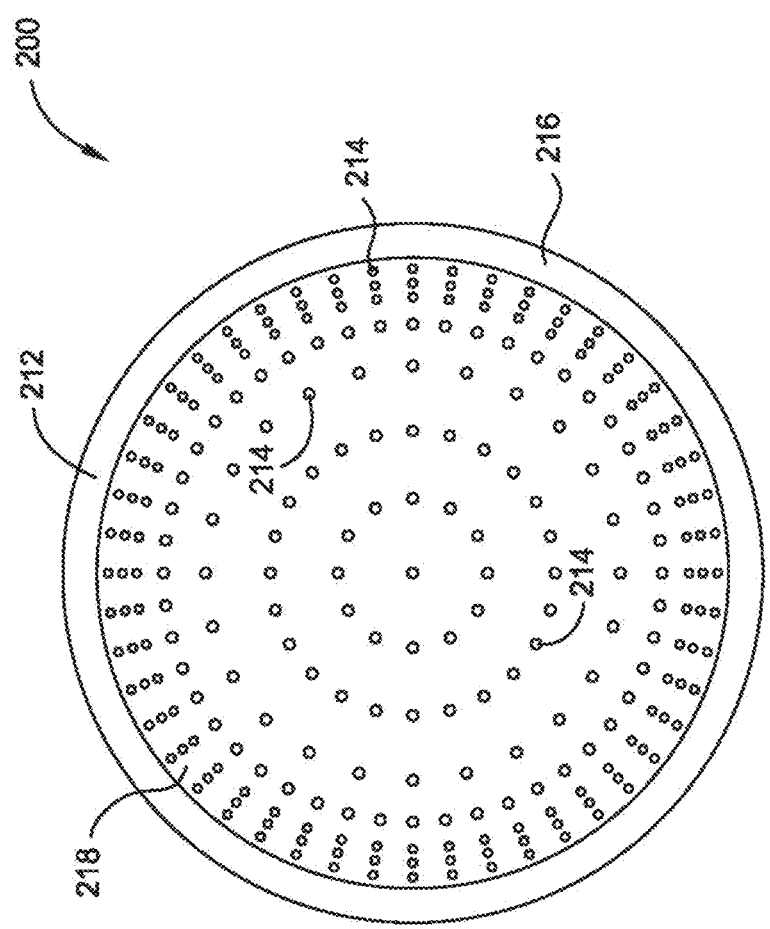
FIG. 3 is a top down view of the substrate support of FIG. 2.

FIG. 3 is a top down plan view of the substrate support 200 showing the substrate chucking surface 212. Here, the features 214 are shown surrounded by the ledge 216. In one example, the number of features 214 is greater than 500, such as, about 1000. By increasing the number of features 214, the area provided for chucking a substrate to the substrate chucking surface 212 is greatly increased. As shown, the number of features 214 (i.e., density) is greater at a peripheral location of the recess 218 near the ledge 216 than at a center of the recess 218. That is, the features 214 are greater in number per unit area at a periphery of the substrate chucking surface 212 of the substrate support 200 than at a central region thereof. The radial distribution of the features 214 is greater towards the periphery of the substrate chucking surface 212 than at a central region thereof. In one example, the number of features 214 increases radially outward from a center of the substrate chucking surface 212 to the ledge 216. Thus, a chucking force applied to a substrate disposed on the substrate chucking surface 212 is increased at the peripheral region thereof thereby allowing a highly bowed substrate, such as 1 mm or higher of deflection, to be held (i.e, "chucked") by the substrate support 200. Here, the features 214 are illustrated as concentric circles. However, the arrangement of features 214 of FIG. 3 is exemplary and not to be limiting. For example, other numbers and positioning of the features 214 may be used.

Figure 4:
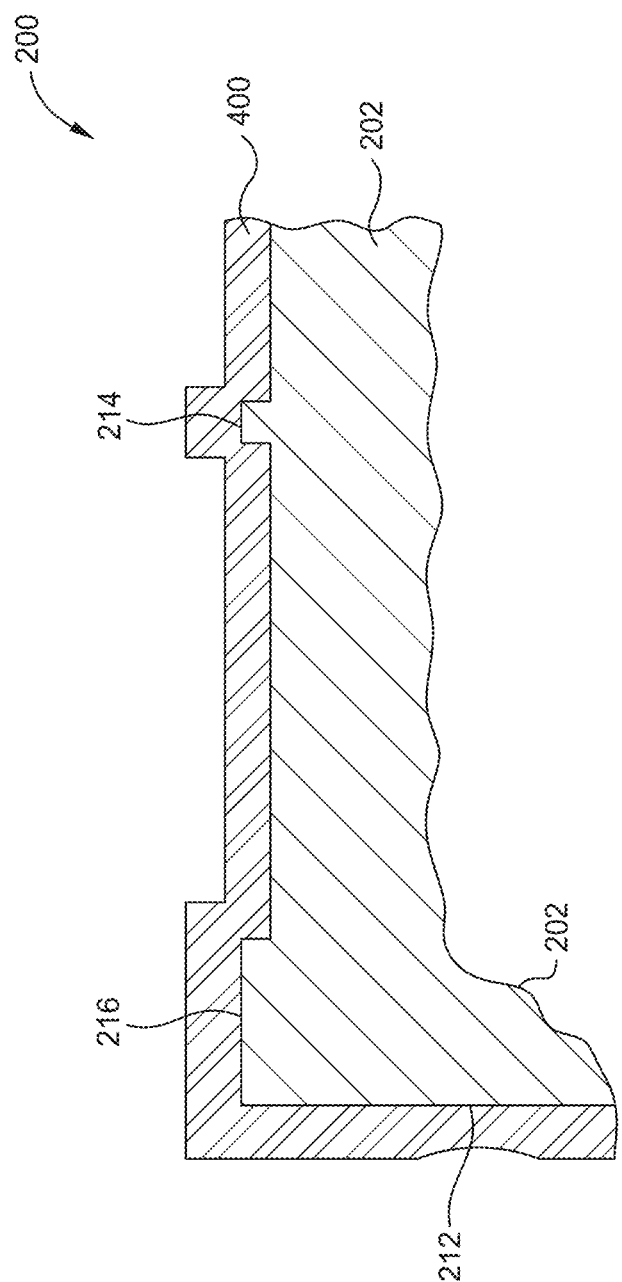
FIG. 4 is an enlarged view of a portion of a substrate support illustrating a seasoning layer, according to an embodiment of the disclosure.

FIG. 4 is an enlarged portion of the surface of the dielectric body 202 of FIG. 2. In order to further improve the chucking of the substrate support 200, a seasoning layer 400 is optionally included on the features 214 and the ledge 216 of the dielectric body 202. The seasoning layer 400 is formed from aluminum oxide, silicon oxide, silicon nitride, silicon oxycarbide, or thermal oxide of any combination thereof among other materials, which are resistant to degradation from exposure to the chemistry used in the processing of a substrate. The seasoning layer 400 may be formed one time or in-situ between each processing step of a substrate, such as part of a cleaning cycle of a chamber. Further, the seasoning layer 400 may be formed in-situ within the same chamber in which the substrate support 200 operates or in a different chamber. In some embodiments, the seasoning layer 400 may be formed ex-situ. The seasoning layer 400 may have a thickness between about 0.1 microns to about 4 microns, for example, such as, between 0.5 microns and 2 microns. In some embodiments, the seasoning layer 400 is formed in-situ and has a thickness of less than 1 micron, such as about 0.7 microns. The seasoning layer 400 improves the resistance of the dielectric body 202 to degradation from exposure to the processing chemistry. Thus, a desired roughness, such as less than 5 micrometers, for example less than 1 micrometer, like between about 0.06 micrometers and about 0.6 micrometers, of the dielectric body 202 is maintained for much longer than conventional designs thereby improving the ability of the substrate support 200 to chuck highly bowed substrates at high temperatures, such as above 550 degrees Celsius, like about 650 degrees Celsius.

Figure 5A:
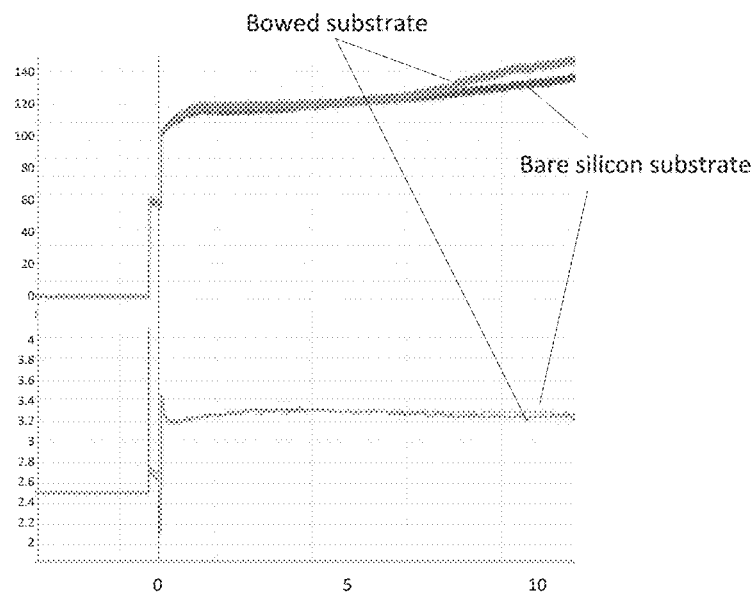
FIG. 5A illustrates an example of experimental results for measured leakage currents flowing through an un-seasoned dielectric body of a substrate support and the measured electrical resistance R of the dielectric body as a function of time during a plasma process performed in a plasma processing chamber.
Figure 5B:
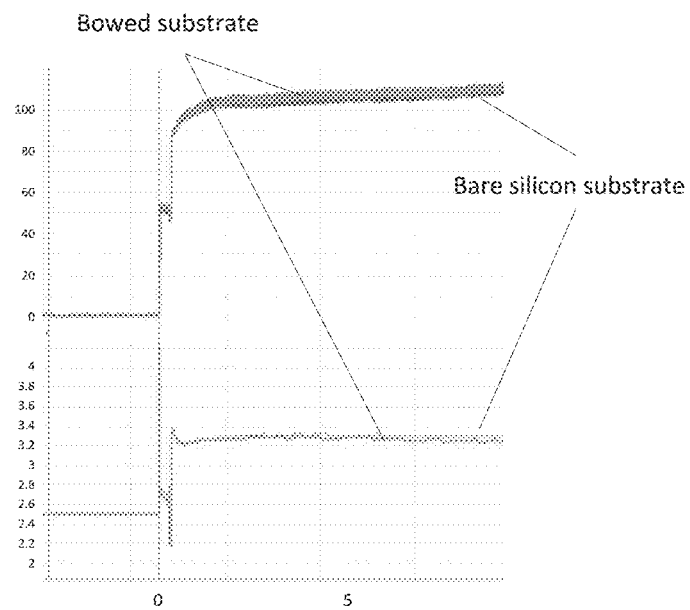
FIG. 5B illustrates an example of experimental results for measured leakage currents flowing through a seasoned dielectric body of a substrate support and the measured electrical resistance R of the dielectric body as a function of time during a plasma process performed in a plasma processing chamber.

FIGS. 5A and 5B provide examples of experimental results for measured leakage currents flowing through the dielectric body 202 (upper curves) and the measured electrical resistance R of the dielectric body 202 (lower curves) as a function of time as the electrode 118 is biased by the power source 108 during a plasma process performed in a plasma processing chamber.

In FIG. 5A, electrostatic chucking results during plasma processing in a plasma processing chamber are shown for a process using a bare silicon substrate and a process using a bowed substrate without a seasoning layer 400 formed thereon. As seen in FIG. 5A, the leakage currents from both the bare silicon substrate and the bowed substrate increase with increasing time.

In FIG. 5B, electrostatic chucking results during plasma processing in the same plasma processing chamber as used in FIG. 5A, but using a seasoned electrostatic chuck. In this example, the results are shown for a process using a bare silicon substrate and a process using a bowed substrate having a silicon oxide layer formed thereon. As seen in FIG. 5B, the leakage currents from the bare silicon substrate and the bowed substrate are removed. Thus, the use of the seasoning layer 400 in this example eliminates or reduces the overall leakage currents for a bare silicon substrate and a bowed substrate, and improves the chucking performance.

In another embodiment, the substrate support 200 is designed with specified performance parameters in order to improve the chucking ability thereof. In one example, the dielectric body 202 is designed to have a leakage current between about 15 mA and about 115 mA. By limiting the leakage current of the substrate support 200, the uniformity of the chucking force provided thereby is increased significantly thus improving quality of the substrate processing.

In another example, the dielectric body 202 is selected to have a desired resistivity in relation to an operating temperature thereof, such as a resistivity between about $0.1 \times 10^{10}$ Ohm-cm and about $1.0 \times 10^{11}$ Ohm-cm. For example, the dielectric body 202 can be designed to have a resistivity between about $0.1 \times 10^{10}$ Ohm-cm and about $1.0 \times 10^{11}$ Ohm-cm at about 550 degrees Celsius, such as between about $0.8 \times 10^{10}$ Ohm-cm and about $7 \times 10^{10}$ Ohm-cm. By increasing the resistivity, the voltage needed to provide an adequate chucking force is lowered thus preventing arcing of the plasma. In another example, the dielectric body 202 can be designed to have a resistivity between about $0.1 \times 10^{10}$ Ohm-cm and about $1.0 \times 10^{11}$ Ohm-cm at about 350 degrees Celsius, such as about $0.2 \times 10^{10}$ Ohm-cm and about $5 \times 10^{10}$ Ohm-cm. Increasing the resistivity results in better chucking performance at the lower temperatures.

While the foregoing is directed to embodiments of the present disclosure, other and further embodiments of the disclosure may be devised without departing from the basic scope thereof, and the scope thereof is determined by the claims that follow.

What is claimed is:

1. A substrate support comprising:
   a dielectric body having a substrate chucking surface thereon, the substrate chucking surface defined by
      a ledge formed about a periphery of the dielectric body; and
      a plurality of features formed radially inward of the ledge as concentric circles, wherein each feature of the plurality of features has a height of about 10 microns to about 50 microns, and the number of features per unit area increases radially from a center of the substrate chucking surface to the ledge such that a chucking force to a substrate disposed on the substrate chucking surface of the dielectric body increases toward a periphery of the substrate,
      wherein the dielectric body has a resistivity between about $0.1 \times 10^{10}$ Ohm-cm and about $1.0 \times 10^{11}$ Ohm-cm;
   an electrode disposed within the dielectric body; and
   a temperature control device disposed within the dielectric body and configured to heat the dielectric body.

2. The substrate support of claim 1, wherein each feature of the plurality of features has a diameter between about 1 mm and about 2 mm.

3. The substrate support of claim 1, wherein the plurality of features comprises about 1000 features.

4. The substrate support of claim 1, wherein the dielectric body has a leakage current between about 15 milliamps and about 115 milliamps.

5. The substrate support of claim 1, wherein the temperature control device is configured to heat the dielectric body to a temperature above 350 degrees Celsius.

6. A substrate support comprising:
   a dielectric body having a substrate chucking surface thereon, the substrate chucking surface defined by
      a ledge formed about a periphery of the dielectric body; and
      a plurality of features formed radially inward of the ledge as concentric circles, wherein each feature of the plurality of features has a height of about 10 microns to about 50 microns, and the number of features per unit area increases radially from a center of the substrate chucking surface to the ledge such that a chucking force to a substrate disposed on the substrate chucking surface of the dielectric body increases toward a periphery of the substrate,
      wherein the dielectric body has a resistivity between about $0.1 \times 10^{10}$ Ohm-cm and about $1.0 \times 10^{11}$ Ohm-cm;
   an electrode disposed within the dielectric body;
   a temperature control device disposed within the dielectric body and configured to heat the dielectric body; and
   a seasoning layer formed on the dielectric body which is resistant to degradation from exposure to a processing chemistry.

7. The substrate support of claim 6, wherein each feature of the plurality of features has a diameter between about 1 mm and about 2 mm.

8. The substrate support of claim 6, wherein the seasoning layer has a thickness of between about 0.5 microns to about 10 microns.

9. The substrate support of claim 6, wherein the seasoning layer comprises silicon oxide.

10. The substrate support of claim 6, wherein the temperature control device is configured to heat the dielectric body to a temperature above 350 degrees Celsius.

11. A processing chamber comprising:
    a chamber body; and
    a substrate support disposed within the chamber body, the substrate support comprising:
       a dielectric body having a substrate chucking surface thereon, the substrate chucking surface defined by
          a ledge formed about a periphery of the dielectric body; and
          a plurality of features formed radially inward of the ledge as concentric circles, wherein each feature of the plurality of features has a height of about 10 microns to about 50 microns, and the number of features per unit area increases radially from a center of the substrate chucking surface to the ledge such that a chucking force to a substrate disposed on the substrate chucking surface of the dielectric body increases toward a periphery of the substrate,
          wherein the dielectric body has a resistivity between about $0.1 \times 10^{10}$ Ohm-cm and about $1.0 \times 10^{11}$ Ohm-cm;
       an electrode disposed within the dielectric body; and
       a temperature control device disposed within the dielectric body and configured to heat the dielectric body.

12. The processing chamber of claim 11, wherein each feature of the plurality of features has a diameter between about 1 mm and about 2 mm.

13. The processing chamber of claim 11, wherein the plurality of features comprises about 1000 features.

14. The processing chamber of claim 11, wherein the dielectric body has a leakage current between about 15 milliamps and about 115 milliamps.

15. The processing chamber of claim 11, wherein the temperature control device is configured to heat the dielectric body to a temperature above 350 degrees Celsius.

\* \* \* \* \*